United States Patent [19]

Inomata et al.

[11] Patent Number: 5,723,978
[45] Date of Patent: Mar. 3, 1998

[54] PHOTO-INDUCIBLE MAGNETIC EXCHANGE COUPLING DEVICE

[75] Inventors: Koichiro Inomata; Roger Highmore; Keiichiro Yusu; Yoshinori Takahashi, all of Kanagawa-ken, Japan

[73] Assignee: Kabushiki Kaisha Toshiba, Kanagawa-ken, Japan

[21] Appl. No.: 392,523

[22] Filed: Feb. 23, 1995

[30] Foreign Application Priority Data

Feb. 24, 1994 [JP] Japan ................................ 6-025803
Jun. 8, 1994 [JP] Japan ................................ 6-126317

[51] Int. Cl.$^6$ ............................ G01R 33/12; H01L 43/08
[52] U.S. Cl. ........................................ 324/235; 324/226
[58] Field of Search ........................ 369/13; 324/200, 324/226, 235, 244, 249, 252, 261, 262

[56] References Cited

U.S. PATENT DOCUMENTS 4,871,614  10/1989  Kobayashi ........................ 369/13

OTHER PUBLICATIONS

Inomata, et al., "Giant Magnetoresistance and Low Saturation Fields in Co–Fe/Cu Multilayers," Journal of Magnetism & Magnetic Materials, vol. 126 (1993).

"Light Induced Magnetic Exchange–Coupling", B. Briner et al., Z. Phys. B92, pp. 137–139, (1993).

"Photoinduced Antiferromagnetic Interlayer Coupling in Fe/(Fe–Si) Superlattices", J.E. Mattson et al., Physical Review Letters, 71 (1):185–188 (1993).

*Primary Examiner*—Walter E. Snow
*Attorney, Agent, or Firm*—Finnegan, Henderson, Farabow, Garrett & Dunner, L.L.P.

[57] ABSTRACT

A magnetic device, comprises a first magnetic layer; a second magnetic layer on the magnetic layer and having a coercive force smaller than that of the first magnetic layer; a semiconductor layer between the first and second magnetic layers so that photo-induced magnetism occurs between the first and second magnetic layers when the semiconductor layer is irradiated with light, a third magnetic layer on the second magnetic layer, the third magnetic layer having a coercive force larger than the coercive force of the second magnetic layer, and a second semiconductor layer between the second and third magnetic layers, magnetism being induced between the second and third magnetic layers when the second semiconductor layer is irradiated with light.

17 Claims, 16 Drawing Sheets

5,723,978

1

PHOTO-INDUCIBLE MAGNETIC EXCHANGE COUPLING DEVICE

BACKGROUND OF THE INVENTION

1. Field of the Invention

This invention relates to a photo-inducible magnetic device, the magnetic properties of which can be changed by light-irradiation.

2. Description of the Related Art

Recently, a photo-induced magnetic phenomenon was discovered. Phy.Rev.Lett.71,185(1993) and Z.Phy.B 92,137 (1993) described that magnetic properties of a multilayer composed of thin Fe layers (magnetic layers) separated by Si or SiO (semiconductor layers) can be changed by light-irradiation. However, a practical application of the phenomenon is not described in these papers.

The photo-induced magnetic phenomenon is believed to be caused by exchange-coupling between neighboring magnetic layers due to carriers activated in the semiconductor layers inserted between neighboring magnetic layers when the semiconductor layers are irradiated with light.

The magnetic properties of the multilayer can be changed by light-irradiation, but the irradiated state cannot be maintained without maintaining the light irradiation.

Further, the direction of magnetization (magnetic spin) of the multilayer may change randomly as a result of light-irradiation. A minimum unit of the multilayer is composed of an upper magnetic layer and a lower magnetic layer with a semiconductor layer inserted between the upper and lower magnetic layers. It is the equally probable that the magnetic spins of the upper magnetic layer or the lower magnetic layer will change. As a result, the direction of the magnetization of the multilayer after light-irradiation cannot be accurately predicted.

Therefore, a device using photo-induced magnetism has not been commercially available.

SUMMARY OF THE INVENTION

Accordingly, an object of the present invention is to provide a photo-inducible magnetic device whose magnetic state can be maintained after light-irradiation is terminated.

Another object of the present invention is to provide a photo-inducible magnetic device whose magnetization direction can be controlled by light-irradiation.

Another object of the present invention is to provide a reliable device which uses photo-induced magnetism.

The present invention provides a photo-inducible magnetic device, comprising a first magnetic layer. A second magnetic layer is positioned in overlapping relation with the first magnetic layer and has a coercive force smaller than that of the first magnetic layer. A semiconductor layer is interposed between the first and second magnetic layers so that photo-induced magnetism occurs between the first and second magnetic layers when the semiconductor layer is irradiated with light. It is preferred that each magnetic layer have an in-plane uniaxial magnetic anisotropy. Each magnetic layer may be a vertical magnetized layer.

The present invention also may include a third magnetic layer in overlapping relation with the second magnetic layer, the third magnetic layer having a coercive force greater than the coercive force of the second magnetic layer, and a second semiconductor layer between the second and third magnetic layers, magnetism being induced between the second and third magnetic layers when the second semiconductor layer is irradiated with light. The second semiconductor layer may be of a material different from the material of the first semiconductor layer. In this case, magnetism is induced between the first and second magnetic layers when the first semiconductor layer is irradiated with light having a first optical wave length, and magnetism is induced between the second and third magnetic layers when the second semiconductor layer is irradiated with light having a second optical wave length. The coercive force of the second magnetic material is preferably sufficiently large that the magnetized direction during light-irradiation is maintained when the light-irradiation is terminated.

In accordance with the invention, the first and second magnetic layers and the semiconductor layer may be sized for mounting in a probe for a scanning microscope, the microscope including means for detecting at least one of a difference in tunneling current between the probe and a sample and a difference in magnetic force between the probe and the sample when the probe is irradiated with light and when the probe is not irradiated with light. The first and second magnetic layers and the semiconductor layer of the invention also may be disposed on a recording medium for writing of information onto the recording medium by light illumination. Preferably, at least one of the first and second magnetic layers comprises a magnetic material containing Co.

The invention also includes a magnetic device, comprising a magnet; and a yoke connected to form a magnetic circuit with the magnet, a part of the yoke being a photo-inducible magnetic material.

The invention also provides a magnetic device, comprising a first body of a magnetic material arranged for movement along a path; a second body of a photo-inducible magnetic material arranged in the direction of the path; and a light source for irradiating portions of the second body of photo-inducible magnetic material along the path to cause photo-induced magnetism, for moving the first body with relation to the second body.

DETAILED DESCRIPTION OF THE PREFERRED EMBODIMENTS

Figure 1A:
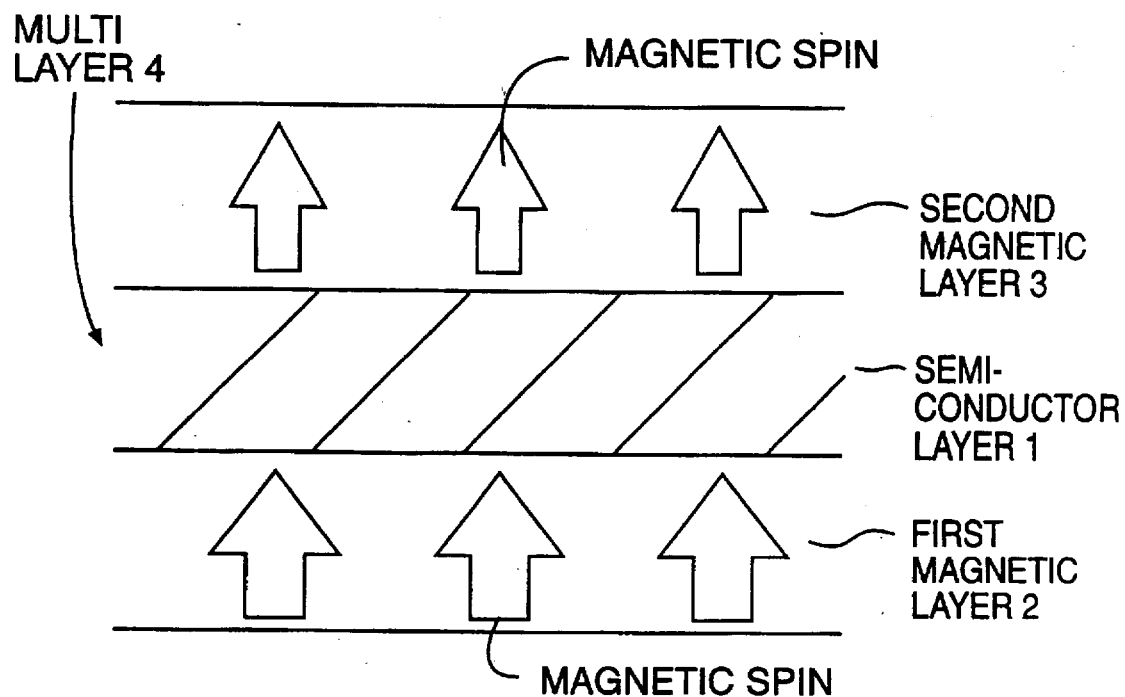
FIGS. 1(a), (b) and (c) show conceptual views of a photo-inducible magnetic device of the present invention showing the change of magnetic spin caused by light irradiation.

Reference will now be made in detail to the present preferred embodiments of the invention, examples of which are illustrated in the accompanying drawings. FIGS. 1(a), (b), and (c) show conceptual views of a magnetic device of the present invention. A first magnetic layer 2 and a second magnetic layer 3 are laminated with a semiconductor layer 1 interposed therebetween, so that these layers compose a multilayer 4 (FIG. 1(a)). An initial state of multilayer 4 is assumed to be ferromagnetic. In other words, the directions of magnetic spins in magnetic layers 2 and 3 are the same (FIG. 1(a)) without light-irradiation.

When multilayer 4 is irradiated by light, multilayer 4 is assumed to become antiferromagnetic. In other words, an antiferromagnetic coupling occurs between first and second magnetic layers 2 and 3 caused by carriers activated in semiconductor layer 1 during light-irradiation (FIG. 1(b)). If multilayer 4 is locally irradiated by light, the magnetic spins can be locally inverted.

Carriers causing photo-induced magnetism would be excited directly by photons or by thermal action due to light-irradiation. In the present invention, photo-induced magnetism includes the both cases.

Figure 1B:
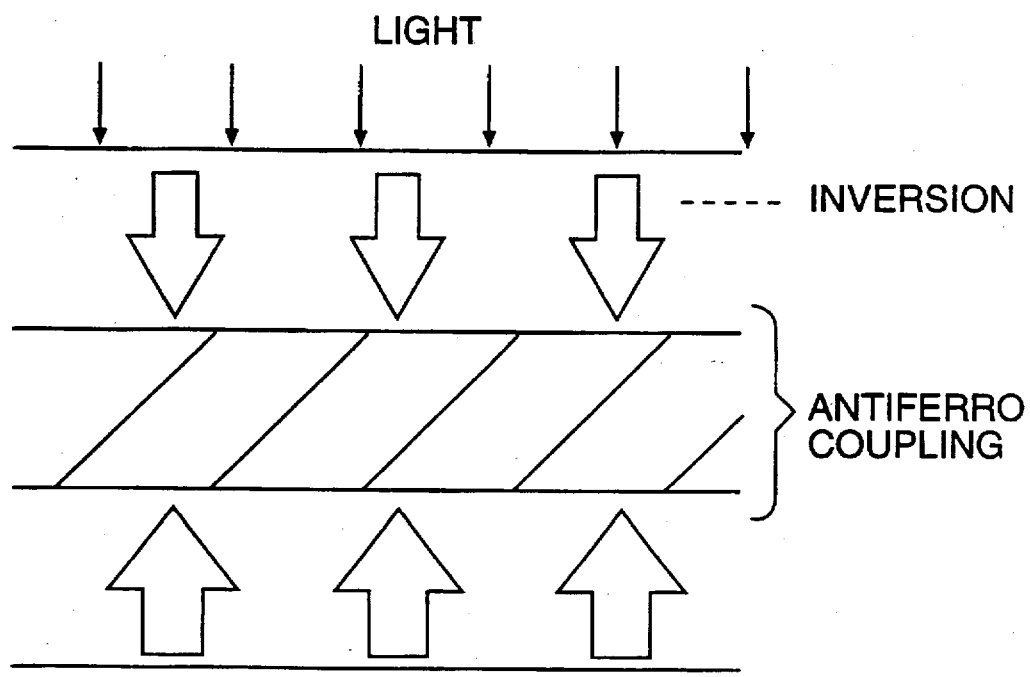
Figure 1C:
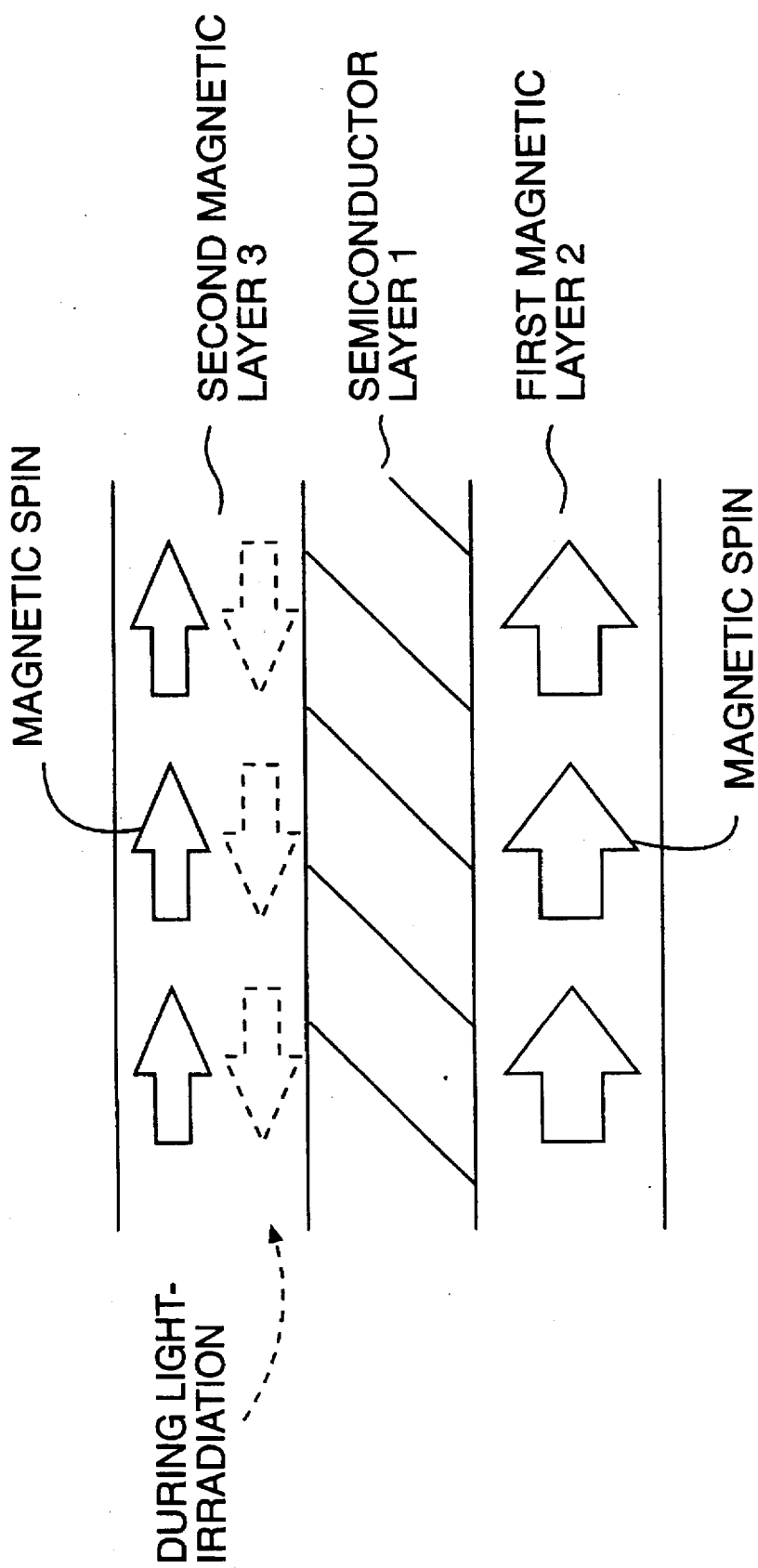

In this case shown in FIGS. 1(a)–(c), first magnetic layer 2 has a larger coercive force than second magnetic layer 3. As a result, it is in second magnetic layer 3 that the direction of magnetic spin changes. The direction of magnetic spin in first magnetic layer 2 does not change. Therefore, the direction of magnetic spin in second magnetic layer 3 can be selectively controlled by light-irradiation without the magnetic spin direction changing in first magnetic layer 2.

Photo-induced magnetism disappears when light-irradiation is terminated. However, if the coercive force of the magnetic layers composing the photo-induced magnetic multilayer is sufficiently high, for example, about 1 kOe or more, the magnetic state obtained by light-irradiation can be maintained after light-irradiation is terminated. For example, magnetic materials composed of Co, such as Co or Co based alloys, (e.g., Co—Cr alloys, Co—Pt alloys or Co-rare earth alloys) are preferable for a magnetic material composing the magnetic layers 2,3, which may be crystal or amorphous, respectively. The amount of Co is preferably about 50% or more.

In FIG. 1(a) and (b), magnetic spins are arranged in an upward direction, i.e., vertical magnetization. However, the above-mentioned phenomenon also can be applied to a multilayer whose magnetic spins are arranged in a plane shown in FIG. 1(c). In FIG. 1(c), arrows of continuous lines indicate magnetic spins of an initial state and arrows of broken lines indicate magnetic spins of a light-irradiated state. In this case, the magnetic spin of second magnetic layer 3 could be inverted.

Further, it is preferable that an in-plane uniaxial magnetic anisotropy is introduced in magnetic layers 2,3 so that the magnetic properties before and after light-irradiation can be significantly changed. If an uniaxial magnetic anisotropy is not introduced, directions of magnetic spins may be different in magnetic domains of magnetic layers 2,3. As a result, there could be a region where the photo-induced magnetism is cancelled or weakened.

In FIGS. 1(a), (b), and (c), the initial state is assumed to be ferromagnetic. However, sometimes it could be antiferromagnetic or nonmagnetic. An initial state depends on properties of a multilayer, for example, the materials composing a multilayer, the thickness of each layer composing a multilayer, the interface states of each layer composing a multilayer, or the crystal structure of a multilayer.

The dependency resembles a magnetoresistance superlattice, which is composed of coupled layers of a magnetic layer, e.g., Co—Fe alloy, and a nonmagnetic layer, e.g., Cu, which is described in J.Mag.Magn.Mater.,126,425 (1993). In this case, the magnetism of superlattices changes from antiferromagnetic to ferromagnetic as a function of the thickness of a nonmagnetic layer, periodically and, also, the strength of exchange coupling between neighboring magnetic layers changes by the state of the interface between a magnetic layer and a nonmagnetic layer.

As mentioned above, photo-induced magnetism is sometimes antiferromagnetic and sometimes ferromagnetic. Therefore, when a several different photo-induced magnetic multilayers are stacked, interesting properties can be obtained.

For example, a first semiconductor layer may be inserted between a first magnetic layer and a second magnetic layer and, further, a second semiconductor layer may be inserted between a third magnetic layer and the second magnetic layer.

When the multilayer is irradiated by a first light which can activate carriers in the first semiconductor layer, the magnetization of the second magnetic layer is put under control of the photo-induced magnetism between the first and second magnetic layers (a first exchange coupling).

On the other hand, when the multilayer is irradiated by a second light which can activate carriers in the second semiconductor layer, the magnetization of the second magnetic layer is put under control of the photo-induced magnetism between the second and third magnetic layers (a second exchange coupling).

Therefore, the direction of magnetic spins in the second magnetic layer can be changed by selecting lights, if coercive forces of the first and third magnetic layers are larger than the coercive force of the second magnetic layer and the direction due to the first exchange coupling is different from the direction due to the second exchange coupling. Furthermore, if the coercive force of the second magnetic layer is sufficiently high to maintain the light-irradiated state after termination of the light-irradiation, the direction can be maintained without the light-irradiation.

It is known that some kinds of photo-induced magnetism are eliminated by increasing light intensity. In such a case, this phenomenon can be used, also.

In the present invention, a magnetic layer of a multilayer of photo-induced magnetic material may be composed of magnetic materials, for example, at least one of Fe, Co, and Ni or alloys thereof, such as Co—Cr alloys or Co—Pt alloys, which contain some amount of transition metals. Further, a magnetic layer of a multilayer of photo-induced magnetic material may be composed of, for example, MnBi alloys, MnCuBi alloys, MnPtSb alloys, Co/Pt superlattices, Co/Pd superlattices, amorphous GdTbFe, amorphous TbFe or amorphous TbFeCo and so on.

A semiconductor layer of a multilayer of photo-induced magnetic material may be composed of semiconductor materials, for example, at least one of Si, a-Si, SiO, ZnO, silicides of transition metals such as $M_xSi_y$ (M: Fe, Co, and Ni or alloys thereof, x and y indicate a ratio), for example, FeSi, $FeSi_2$, $CrSi_2$, $CoSi_2$, or $MnSi_{1.7}$, and so on.

If the energy gap of the semiconductor layer concerning photo-induced magnetism is too small, photo-induced magnetism may be difficult to produce at room temperature. Therefore, the energy gap of the semiconductor layer preferably should be about 0.03 eV or more preferably about 0.05 eV or greater. Since an excessive energy gap would require irradiation by a light having a shorter wavelength and a higher energy, the energy gap preferably should be about 1 eV or less.

Thicknesses of a magnetic layer and a semiconductor layer of a multilayer of photo-inducible magnetic material could be predetermined according to various materials so as to produce photo-induced magnetism. Further, these thicknesses preferably should be predetermined so as to satisfy a condition that an exchange interaction caused by photo-induced magnetism can be effected entirely within the thickness of the magnetic layer, and that irradiated light can reach the semiconductor layer.

Since magnetic properties of photo-inducible magnetic material depend on the amount of magnetic material in the multilayer, i.e., the total thickness of the magnetic layers in the multilayer, the thickness of the magnetic layer preferably should be as thick as possible within a range satisfying the above-mentioned condition. Methods for increasing the amount of magnetic material may include increase of the thickness of one layer or increase of a number of stacked layers.

Although depending on material, the thickness of the semiconductor layer preferably should be about 0.5 to about 10 nm, the thickness of the magnetic layer preferably should be about 0.5 to about 10 nm, and the entire thickness of the multilayer preferably should be about 1.5 to about 300 nm.

In the present invention, a multilayer may be produced by various methods such as an ion beam sputtering method, a vacuum vapor deposition method, an RF magnetron sputtering method, a vapor deposition method, a CVD method and the like. As a substrate, for example, glasses, crystals, semiconductors, ceramics, oxides or nitrides can be used.

EXAMPLE 1

A first magnetic layer of Co is deposited on a substrate of Si by ion beam sputtering. The thickness of the first magnetic layer is about 2 nm. A semiconductor layer of Si is deposited on the first magnetic layer. The thickness of the semiconductor layer is about 1.5 nm. A second magnetic layer of Fe is deposited on the semiconductor layer. The thickness of the second magnetic layer is about 2 nm. Two sets of Co/Si/Fe/Si are formed on the substrate and compose a multilayer.

Conditions of sputtering are, for example, that after exhausting a chamber at about $5 \times 10^{-7}$ torr, the chamber is filled with $1 \times 10^{-4}$ torr of Ar and then sputtering is performed under the condition that an acceleration voltage of Ar ions is about 400 V and a current of Ar ion beam is about 30 mA.

Figure 2A:
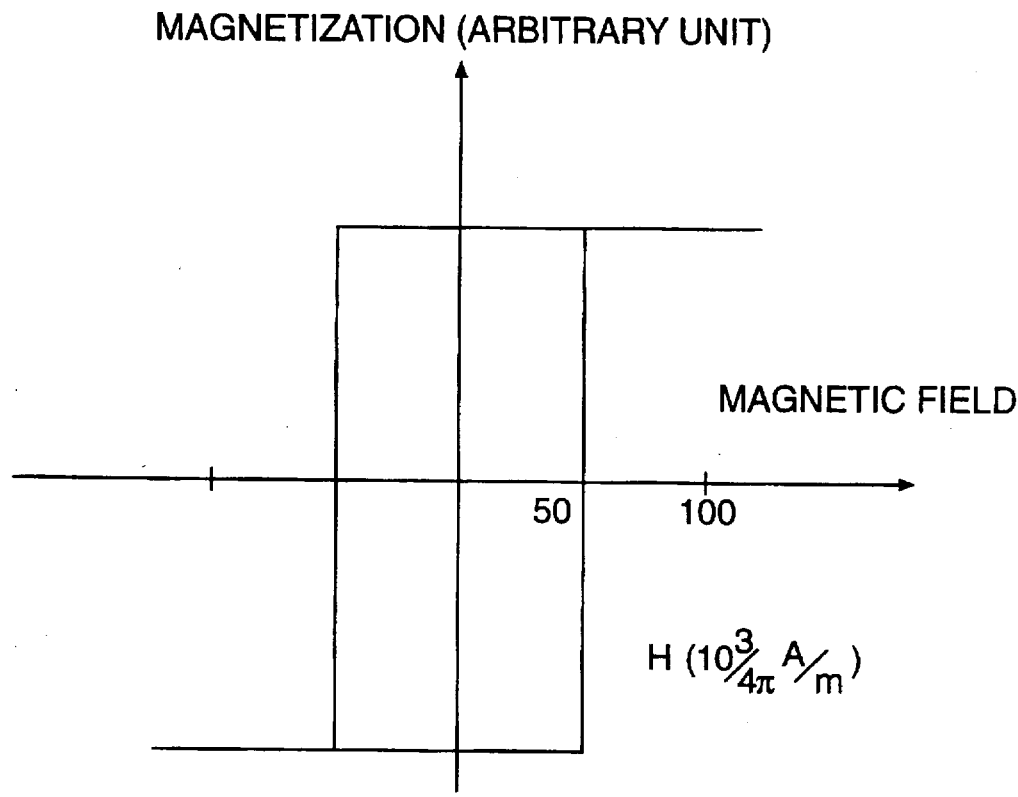
FIGS. 2(a) and (b) show magnetization loops of a photo-inducible magnetic device of the present invention.
Figure 2B:
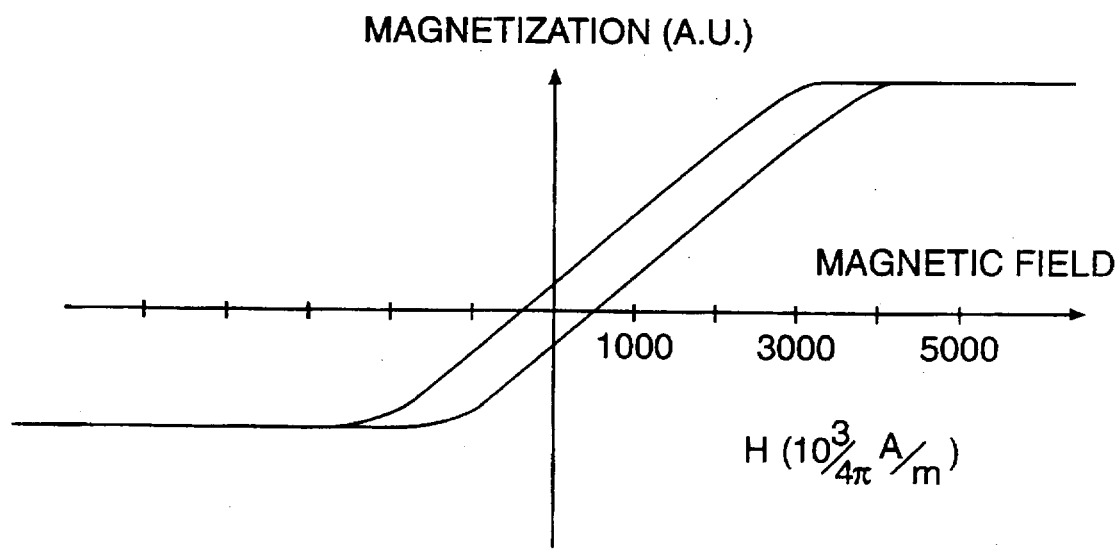

FIG. 2(a) shows a magnetization loop of the multilayer before light-irradiation and FIG. 2(b) shows a magnetization loop of the multilayer during light-irradiating of Ar laser. Such a magnetization loop can be measured by a Kerr effect measuring unit. Since antiferromagnetic coupling occurs with light-irradiation, magnetic spins inverted by the coupling in the second magnetic layer are gradually inverted with application of a magnetic field. As a result, a larger magnetic field is needed for saturation of magnetization of the multilayer during light-irradiation than before light-irradiation.

EXAMPLE 2

A magnetic layer of Fe is formed on a substrate of Si. The thickness of the magnetic layer is about 2 nm. A semiconductor layer of Si is deposited on the magnetic layer. The thickness of the semiconductor layer is about 1.5 nm. Four sets of Fe/Si are formed on the substrate and compose a multilayer.

In this case, the multilayer has a uniaxial magnetic anisotropy introduced in the in-plane direction. Such a uniaxial anisotropy can be introduced, for example, by applying a magnetic field during sputtering in a specified direction.

Figure 3A:
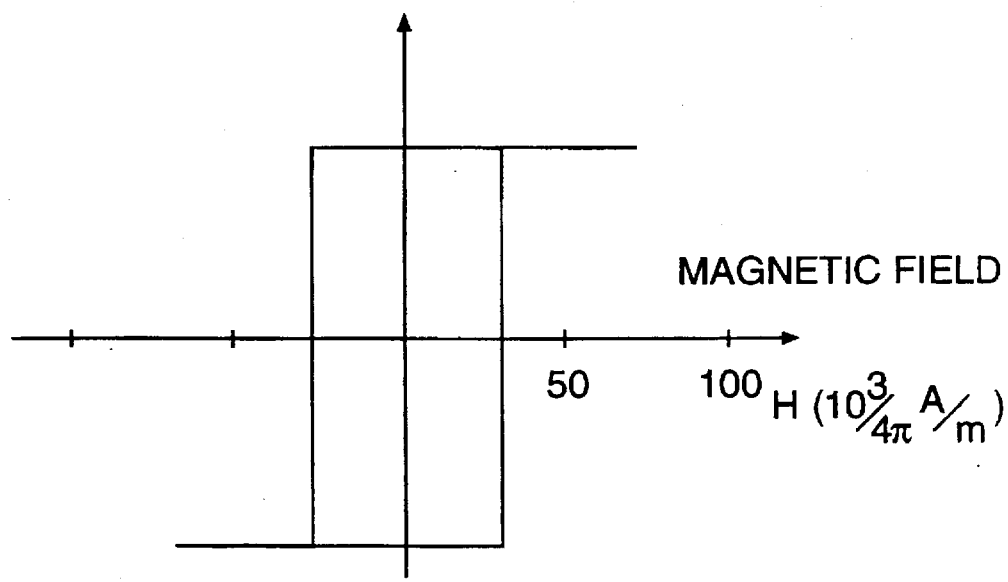
FIGS. 3(a) and (b) show further magnetization loops of a photo-inducible magnetic device of the present invention.
Figure 3B:
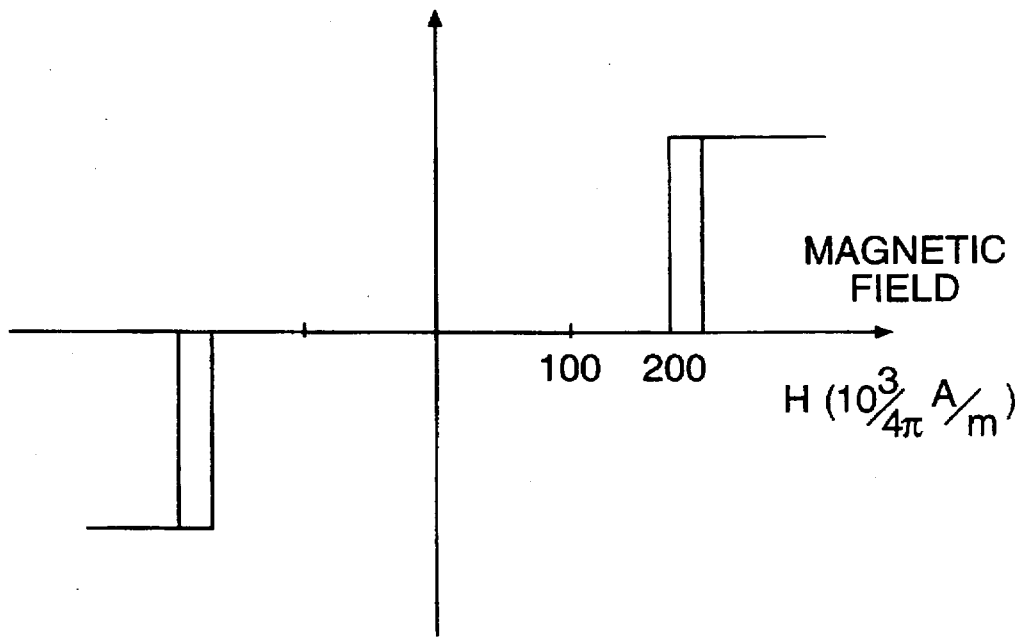

FIG. 3(a) shows a magnetization loop before light-irradiation and FIG. 3(b) shows a magnetization loop during light-irradiating by an Ar laser. The direction of the magnetic field applied to the multilayer during measurement is the same as that of the magnetic anisotropy.

Since antiferromagnetic coupling occurs with light-irradiation, magnetic spins are difficult to switch. As a result, during light-irradiation, the magnetization of the multilayer is immediately saturated when a magnetic field exceeds a value which is a kind of a threshold value. In other words, when a magnetic field exceeds a strength of an antiferromagnetic coupling, the magnetic spins are inverted at once. Therefore, the macro-magnetization state of the multilayer can be greatly changed by introduction of a uniaxial magnetic anisotropy.

EXAMPLE 3

A magnetic layer of $Co_{80}Cr_{20}$ (atomic ratio) is formed on a substrate of Si. The thickness of the magnetic layer is about 4 nm. A semiconductor layer of Si is deposited on the magnetic layer. The thickness of the semiconductor layer is about 1.5 nm. Two sets of $Co_{80}Cr_{20}$/Si are formed on the substrate and compose a multilayer.

In this case, the multilayer has a uniaxial magnetic anisotropy introduced in the in-plane direction, also.

Figure 4:
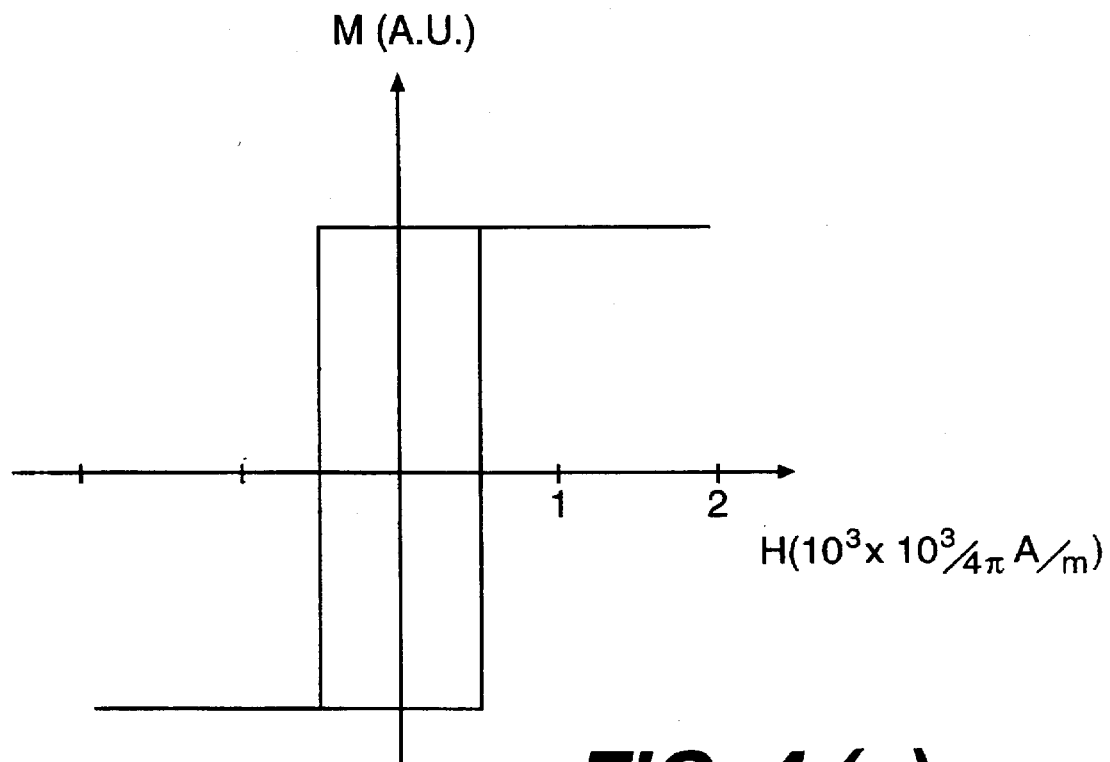
FIGS. 4(a) and (b) show additional magnetization loops of a photo-inducible magnetic device of the present invention.
Figure 4:
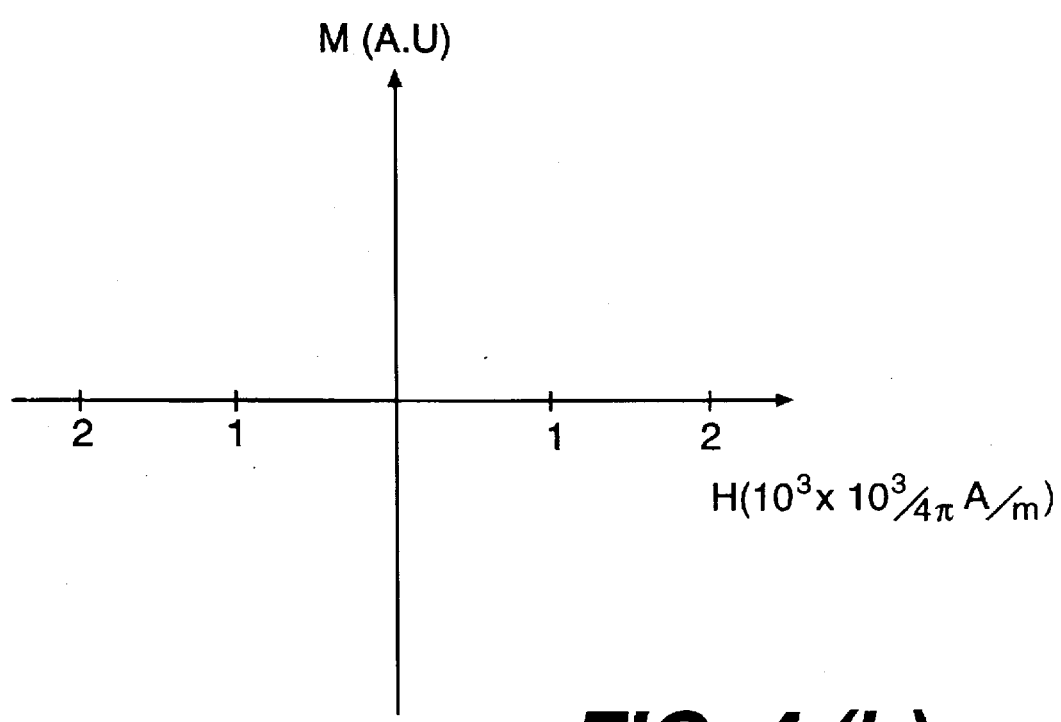

FIG. 4(a) shows a magnetization loop before light-irradiation and FIG. 4(b) shows a magnetization loop during light-irradiation by an Ar laser. The direction of the magnetic field applied to the multilayer during measurement is the same as that of the magnetic anisotropy.

Since antiferromagnetic coupling occurs with light-irradiation and strong, magnetic spins are very difficult to switch. As a result, during light-irradiation, the multilayer is hard to magnetize and the magnetization of the multilayer is almost zero under a magnetic field of more than 1 kOe.

Further, since Co—Cr alloys have a high coercive force, such as more than 1 kOe, the magnetic state during light-irradiation can be maintained without irradiation.

EXAMPLE 4

A first magnetic layer of $Co_{80}Cr_{20}$ is formed on a substrate of Si. The thickness of the first magnetic layer is about 4 nm. A first semiconductor layer of SiOx (x is about 1) is deposited on the first magnetic layer. The thickness of the first semiconductor layer is about 1.5 nm. A second magnetic layer of Fe is formed on the first semiconductor layer. The thickness of the second magnetic layer is about 3 nm. A second semiconductor layer of Si is deposited on the second magnetic layer. The thickness of the second semiconductor layer is about 1.5 nm. A third magnetic layer of $Co_{80}Cr_{20}$ is formed on the second semiconductor layer. The thickness of the third magnetic layer is about 3 nm.

In this case, the multilayer has a uniaxial magnetic anisotropy introduced in the in-plane direction, also.

Figure 5A:
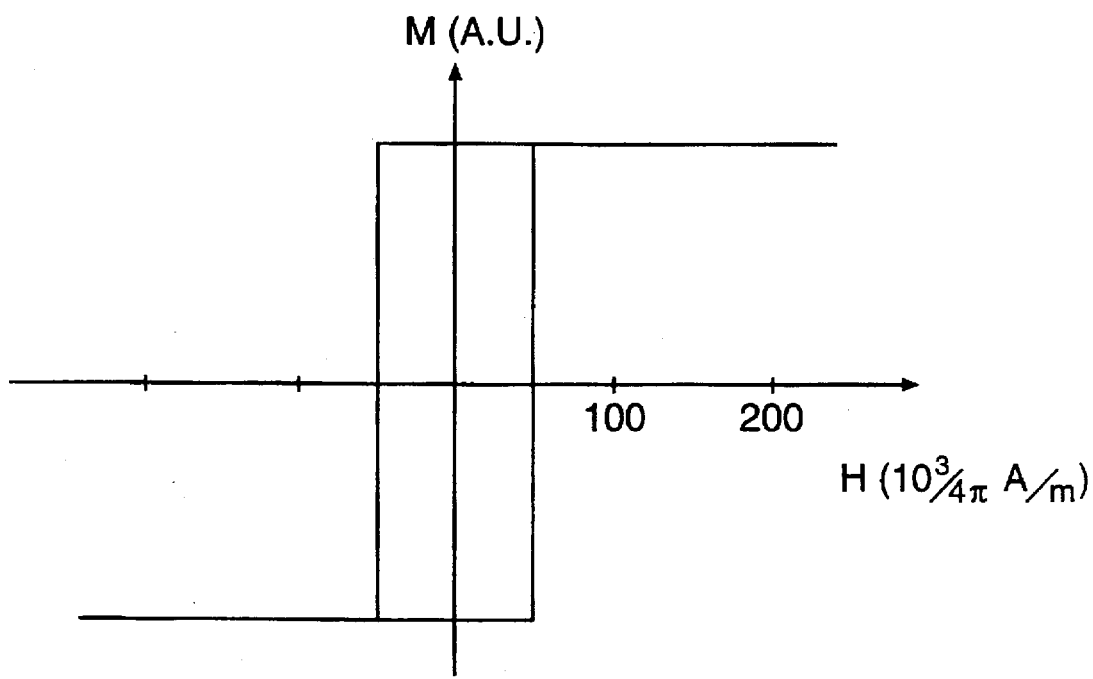
FIGS. 5(a) and (b) show further magnetization loops of a photo-inducible magnetic device of the present invention.
Figure 5B:
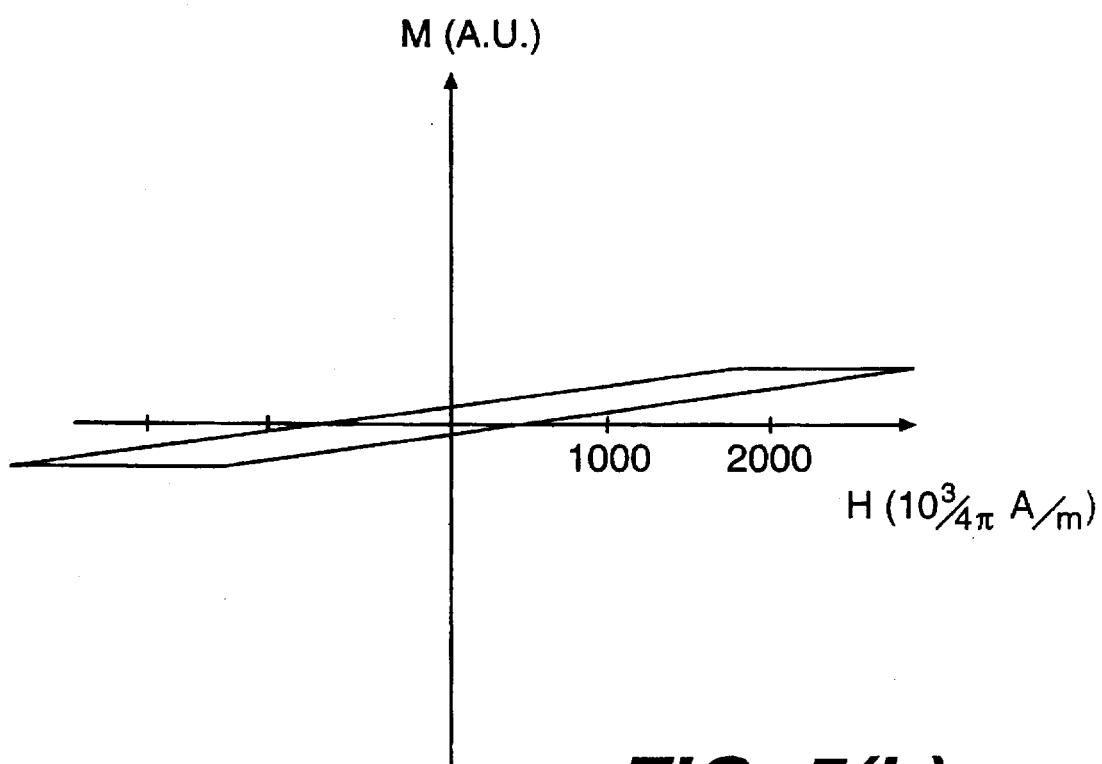

FIG. 5(a) shows a magnetization loop during light-irradiation by an Ar-laser and FIG. 5(b) shows a magnetization loop during light-irradiation by a YAG laser. The direction of the magnetic field applied to the multilayer during measurement is the same as that of the magnetic anisotropy.

Since the energy levels depend upon the semiconductor, a light which can activate carriers in the first semiconductor layer is different in frequency from a light concerning the second semiconductor layer. As a result, since photo-induced magnetism is different between Ar laser irradiation and YAG laser irradiation, the magnetization loops are different from each other.

In this case, photo-induced magnetism between the first and second magnetic layers due to irradiation by the YAG laser is ferromagnetic and photo-induced magnetism between the second and third magnetic layers due to irradiation by the Ar laser is antiferromagnetic.

Therefore, when the multilayer is irradiated by the YAG laser, ferromagnetic coupling occurs between the first and second magnetic layers. On the other hand, when the multilayer is irradiated by the Ar laser, antiferromagnetic coupling occurs between the second and third magnetic layers. As a result, magnetization of the multilayer is smaller during Ar laser irradiation than during YAG laser irradiation as a whole. Since the antiferromagnetic coupling and ferromagnetic coupling are independent, the direction of magnetic spins in the second magnetic layer can be controlled by changing the irradiating light.

EXAMPLE 5

Photo-induced magnetism can be used in a photo sensor.

Figure 6:
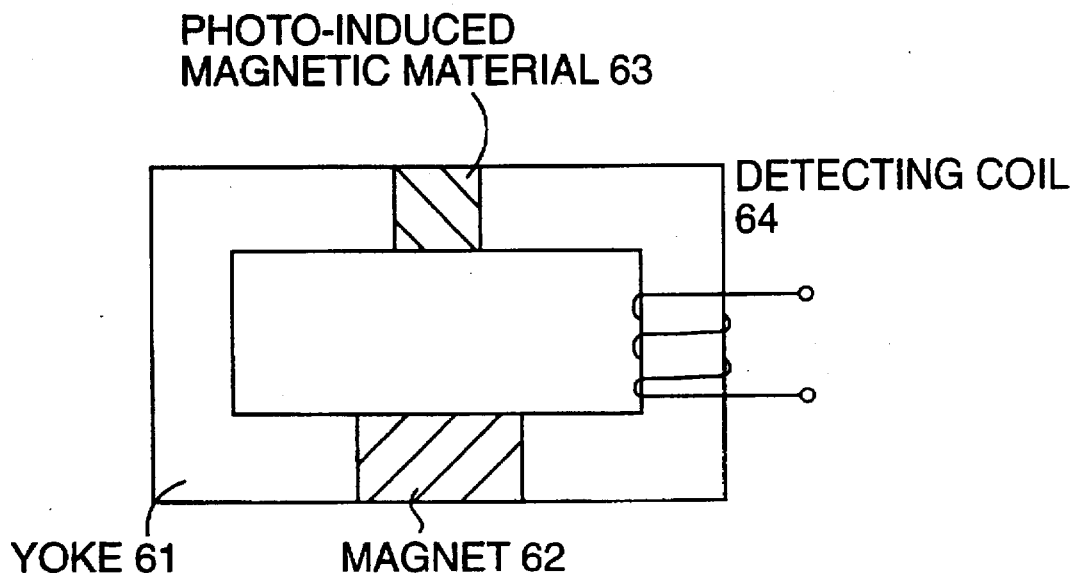
FIG. 6 shows a conceptual view of a photo-inducible magnetic device of the present invention including a yoke.

FIG. 6 shows a conceptual diagram of a photo sensor. A magnetic circuit is composed of a yoke 61 and a magnet 62. A part of yoke 61 is replaced by a photo-induced magnetic material 63, such as a multilayer composed of a magnetic layer and a semiconductor layer. A detecting coil 64 is wound around yoke 61 as a detecting means.

In this case, the photo-inducible material is antiferromagnetic without light-irradiation and becomes ferromagnetic during light-irradiation. Therefore, the magnetic resistance of the magnetic circuit is large without light-irradiation and becomes small during light-irradiation. This is because the magnetic resistance of an antiferromagnetic material is larger than that of a ferromagnetic material.

When the portion composed of the photo-induced material is irradiated by light, the magnetic resistance becomes small and then the magnetic flux immediately increases. As a result, a voltage is induced in detecting coil 64 and the existence of light irradiation can be detected.

The same result can be obtained by using a photo-inducible material which is ferromagnetic without light-irradiation and becomes antiferromagnetic by light-irradiation. In such a case, the magnetic flux immediately decreases with light-irradiation.

Further, a complete change from an antiferromagnetic state to a ferromagnetic state is not required. This is because, even if the magnetic state changes a little, magnetic flux can be changed.

These photo sensors can be modified. For example, a magnet is disposed inside of a box composed of a photo-inducible magnetic material which is ferromagnetic without light-irradiation and becomes antiferromagnetic by light-irradiation. While the box is not irradiated by light, magnetic flux from the magnet is shielded by the box. When the box is irradiated by light, the magnetic flux leaks to the exterior so that the change of the magnetic flux can be measured, e.g., by a detecting coil.

In this example, a detecting coil is used as a detection means. However, other detectors may be used. For example, a movable magnet can be used as the detecting means. While the photo-induced material is antiferromagnetic, the magnet is not affected by the material. However, when the material becomes ferromagnetic, the magnet is attracted to the material or repulsed against the material. Therefore, a mechanical switch could be easily prepared.

EXAMPLE 6

A photo-inducible magnetic material can be applied to an actuator.

Figure 7:
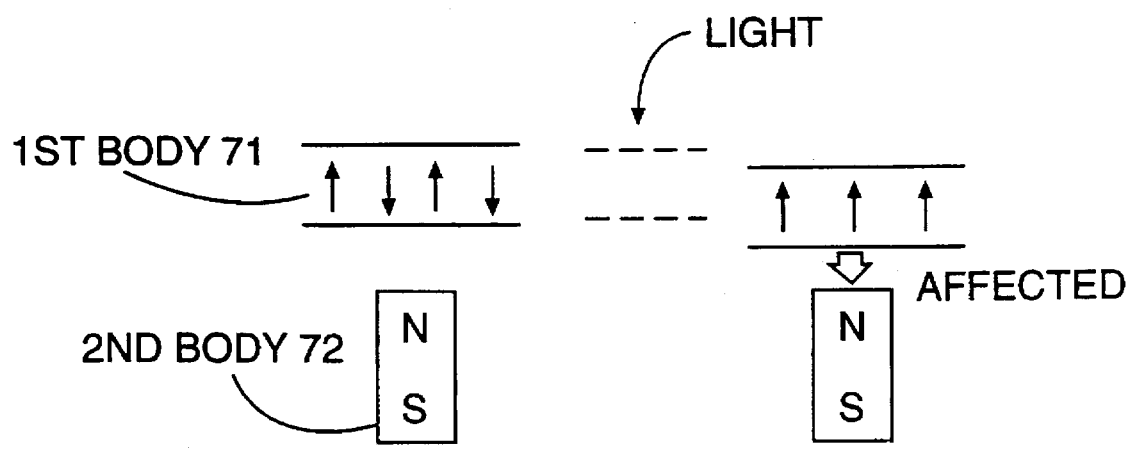
FIG. 7 shows a conceptual view of a photo-inducible magnetic device of the present invention illustrating the movement of a magnetic device.

FIG. 7 shows a conceptual diagram of an actuator concerning the present invention. A first body 71 is composed of a photo-inducible magnetic material which is antiferromagnetic without light-irradiating and becomes ferromagnetic by light-irradiation. First body 71 faces a second body 72 of a magnetic material such as a magnet.

While first body 71 is not irradiated by light, first body 71 is not affected by second body 72. When first body 71 is irradiated by light, first body 71 is attracted to second body 72 (FIG. 7) or repulsed from second body 72 according to the oriented direction of magnetization of first body 71.

When first body 71 is fixed, second body 72 would move. Therefore, the relative portion between first and second bodies 71,72 can be changed by light-irradiation.

Figure 8A:
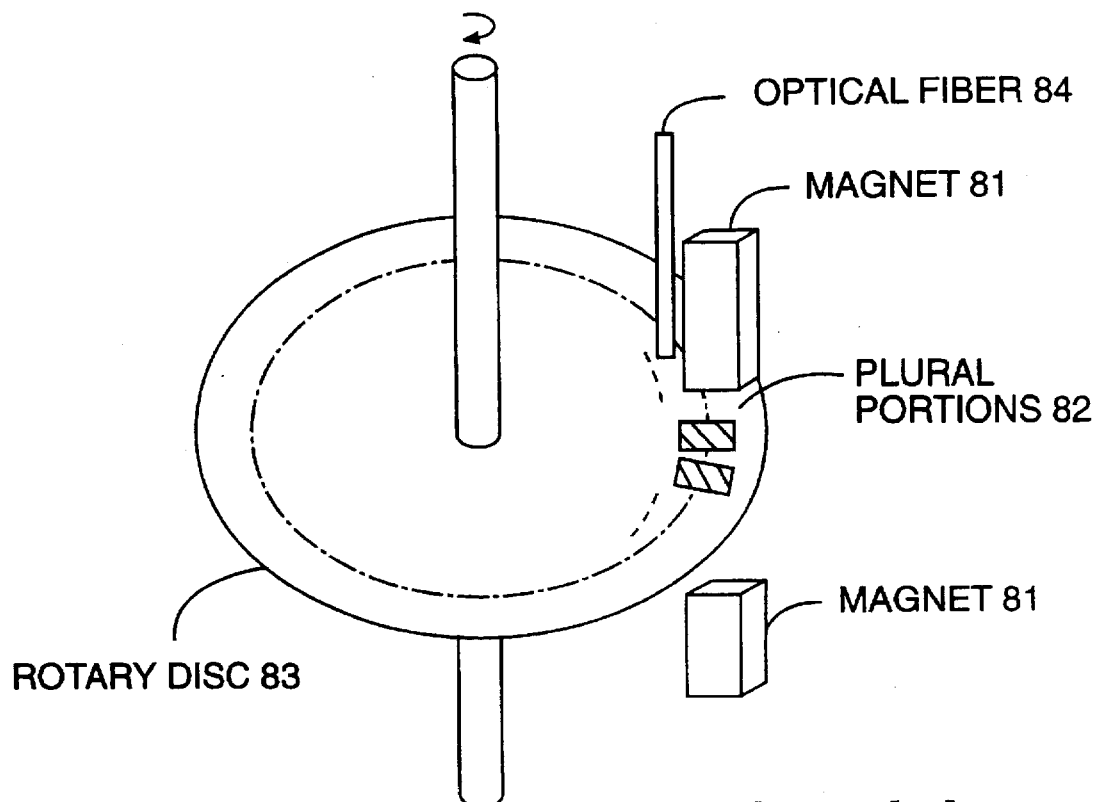
FIGS. 8(a) and (b) show conceptual views of a photo-inducible magnetic device of the present invention applied to a rotatable disc.

FIG. 8(a) shows a conceptual diagram of an actuator which can perform a rotational movement. Plural portions 82 of a photo-inducible magnetic material are separately arranged on a periphery of a rotary disc 83. A magnet 81 is disposed so that a magnetic field is applied to a part of plural portions 82. An optical fiber 84 is disposed so that one of the portions 82 close to magnet 81 can be irradiated by light.

Figure 8B:
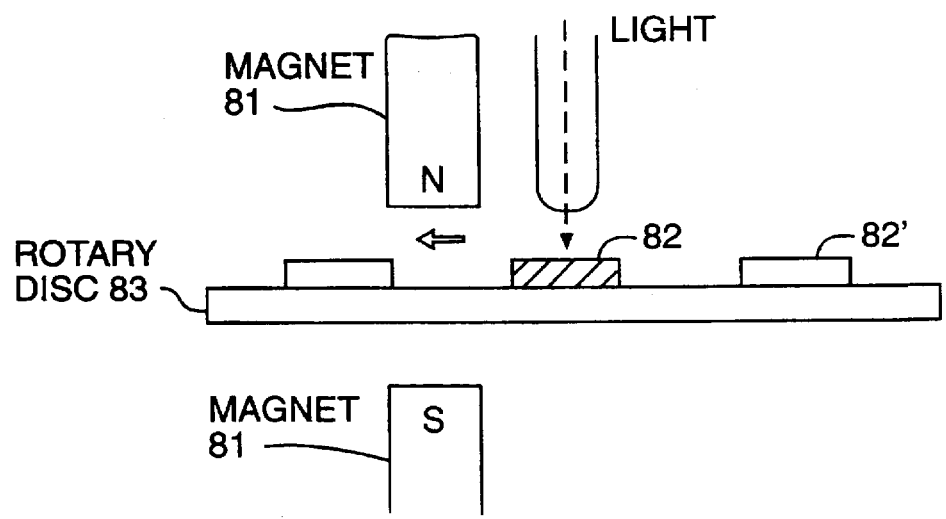

FIG. 8(b) shows a conceptual view of the principal part of the actuator. Disc 83 would move from right to left in FIG. 8(b).

One of portions 82 located immediately before magnet 81, which is in a light-irradiated region, is magnetized by light-irradiation so that the light-irradiated portion 82 is attracted to magnet 81 or repulsed from magnet 81. After that, the light-irradiated portion 82 is out of the light-irradiated region and then resumes its initial state. Then the next portion 82' is irradiated by light so that the next portion 82' is magnetized. These actions are repeated and a rotary movement can be continued.

Figure 9:
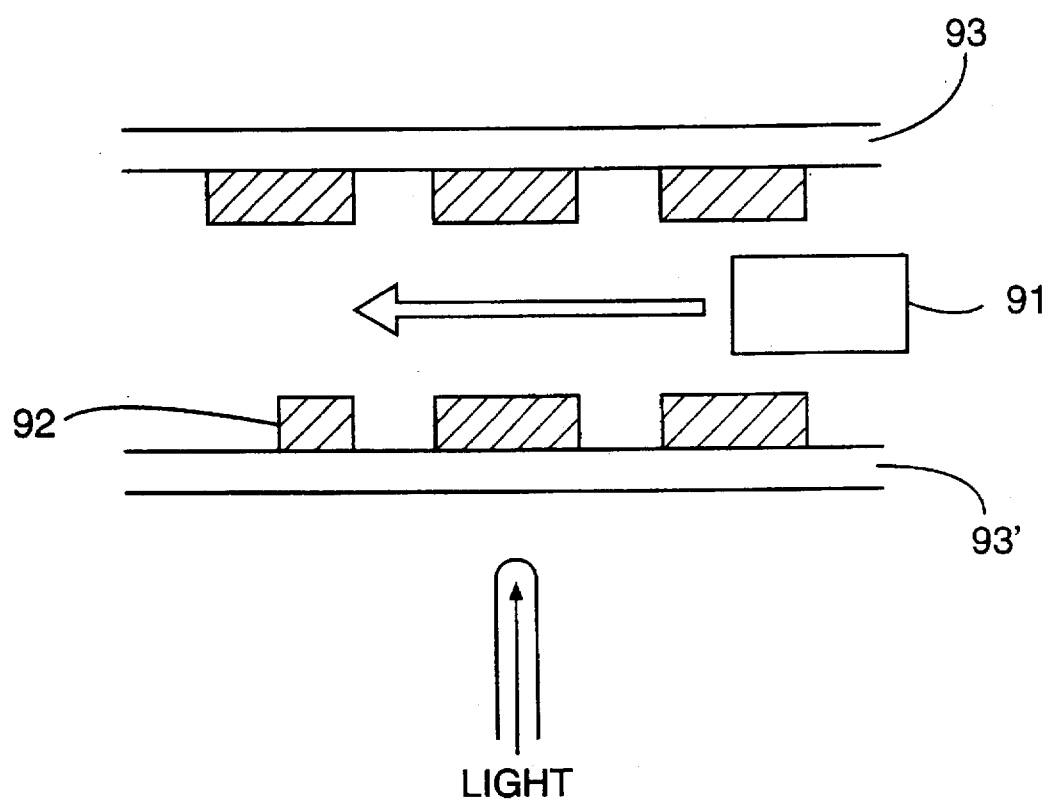
FIG. 9 shows a conceptual view of a photo-inducible magnetic device of the present invention illustrating the inducing of relative motion.

In the above-mentioned example, a disc is the movable element. However, a magnet can be used as a movable body. FIG. 9 shows an illustrative diagram. Two discs 93,93' on which plural portions 92 of a photo-inducible magnetic material are mounted, are opposed to each other. Portions 92 are arranged on the outer periphery of discs 93,93'. A magnet 91 is disposed between discs 93,93' so as to enable rotation coaxial with the axes of discs 93,93'.

By scanning light along the outer periphery, a portion 92 where a photo-inducible magnetic material is magnetized can be moved. For example, if magnet 91 is attracted to a magnetized portion 92, it can be said that the light leads magnet 91. On the other hand, if magnet 91 is repulsed from a magnetized portion 92, it can be said that the light pushes magnet 91.

Timing of light-irradiation could be different between discs 93,93'. For example, spaces between neighboring portions 92 of disc 93 are arranged to face to portions 92 on disc 93'. Alternately irradiating alternately on one and the other of discs 93,93' could make the movement of magnet 91 smooth.

In the above-mentioned example, two discs are used. However, one disc may also be used. Further, using the same principle, a straight line movement can be obtained.

Figure 10:
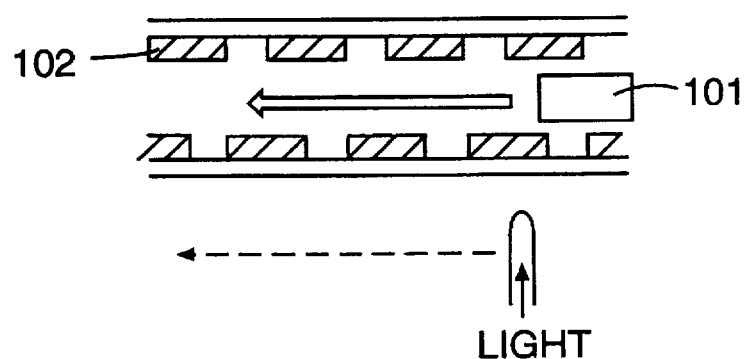
FIG. 10 shows a further conceptual view of a photo-inducible magnetic device of the present invention with a moving light source.

FIG. 10 shows a schematic diagram of a device performing a straight line movement. The structure of this device can be obtained by developing the outer periphery of FIG. 9 in a straight manner. It is like a linear motor.

By scanning light in a direction in which plural portions 102 of a photo-inducible magnetic material are arranged, a region of portion 102 that is magnetized can be moved. As a result, a magnet 101 is attracted to a magnetized region of portions 102 or repulsed as the above-mentioned device in FIG. 9. It is needless to say that a photo-inducible magnetic material can be used as a movable body.

In these above-mentioned devices, the light scanning may be performed by moving an optical fiber per se, or by moving a mirror in connection with a fixed light source.

Also, photo-inducible magnetic materials are divided in these devices. However, this is not necessarily required.

Photo-induced magnetism could be observed in a case where a carrier concentration in a semiconductor layer composing a photo-inducible magnetic material is sufficiently small without light-irradiation. Because the carrier concentration excited by light-irradiation is considered not to be large, the difference is considered to be small between irradiation and not. As a result, the electric resistance of a semiconductor layer composing a photo-inducible magnetic material should be high.

Therefore, carriers excited by local light-irradiation would not be diffused and locally exist. Accordingly, a continuous photo-inducible magnetic material could be used as separated photo-inducible magnetic materials. FIG. 11 shows a conceptual diagram concerning a device using a continuous photo-inducible magnetic material which is antiferromagnetic without light-irradiation and becomes ferromagnetic by light-irradiation.

Figure 11A:
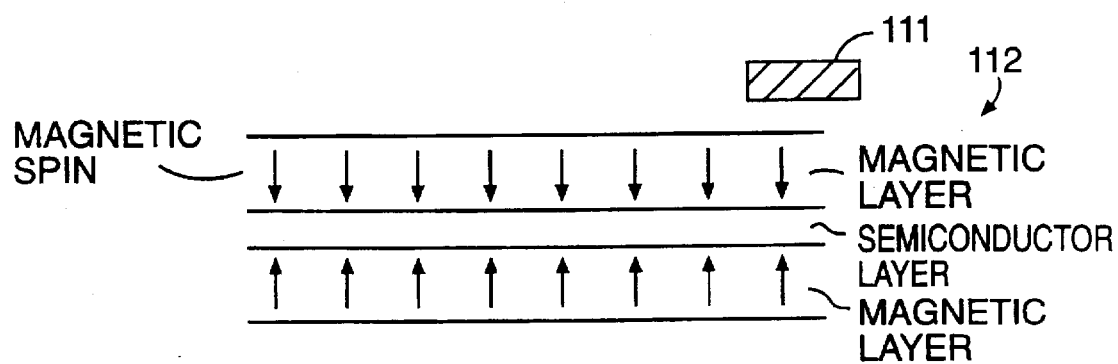
FIGS. 11(a), (b) and (c) show changes in magnetic direction resulting from light irradiation of a photo-inducible magnetic device of the present invention for causing motion of an object.
Figure 11B:
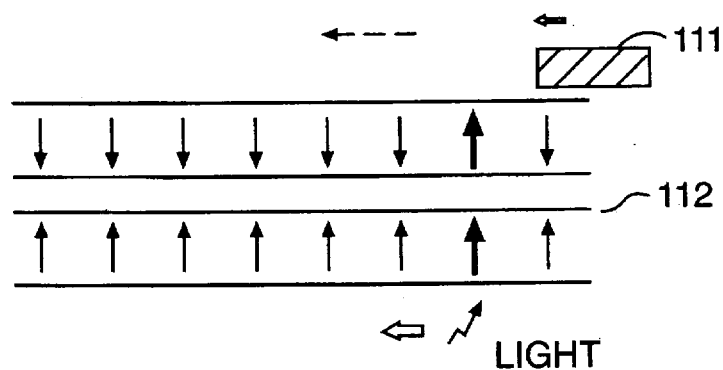
Figure 11C:
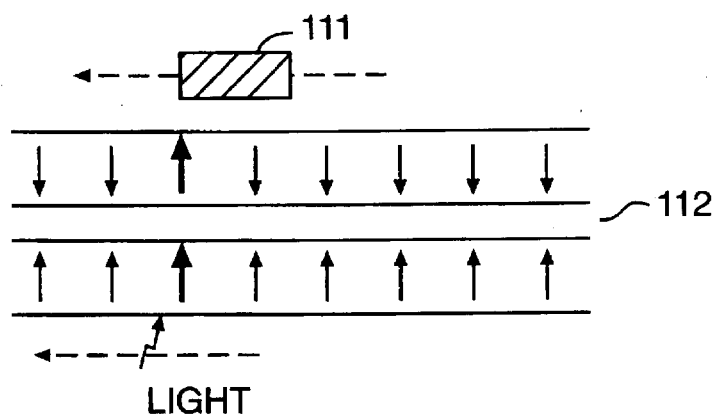

A magnet 111 is disposed on a road 112 of a photo-inducible magnetic material so as to enable motion on road 112 (FIG. 11(a)). By scanning light on road 112, a magnetized portion in road 112 can be moved in the scanning direction. Magnet 111 is, for example, attracted to the magnetized portion (FIG. 11(b)). As a result, magnet 111 moves in the direction of light-scanning (FIG. 11(c)).

It depends on the relation between the magnetization direction of the photo-inducible magnetic material and the pole direction of the magnet if the magnet is attracted to the magnetized portion or repulsed from the portion as the case in FIG. 7.

EXAMPLE 7

A photo-inducible magnetic material can be applied to an ink-jet head.

Figure 12A:
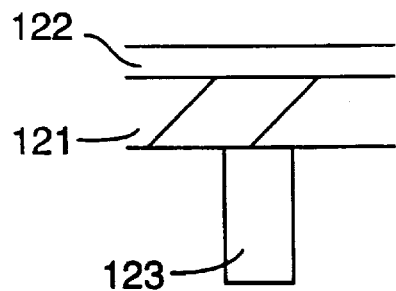
FIGS. 12(a) and (b) show further conceptual views of a photo-inducible magnetic device of the present invention as applied to an inkjet apparatus.

FIGS. 12(a) (b) show conceptual diagrams of an inkjet head utilizing the present invention. A photo-inducible magnetic material 121 which is antiferromagnetic without light-irradiation and becomes ferromagnetic by light-irradiation is used. An ink 122 is electrically conductive and magnetic. A magnet 123 is disposed between photo-inducible magnetic material 121 and ink 122.

Figure 12B:
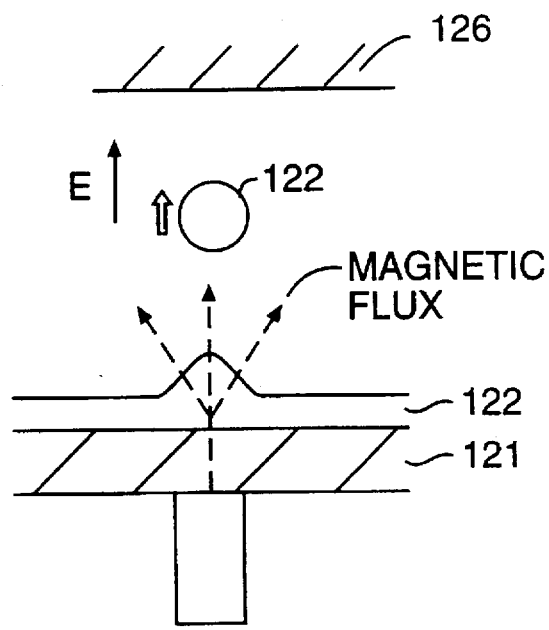

In an initial state shown in FIG. 12(a), i.e., without light-irradiation, magnetic flux is shielded by photo-inducible magnetic material 121. When material 121 is irradiated by light, magnetic flux leaks to ink 122 and ink 122 protrudes. If an electric field exists, the electric field is concentrated in a protruded portion of ink 122 and then the portion could fly to an object 126 shown in FIG. 12(b).

Since as described above, the magnetized portion of photo-inducible magnetic material 121 can be localized, it may not be necessary to divide the nozzles to every dot.

Figure 13:
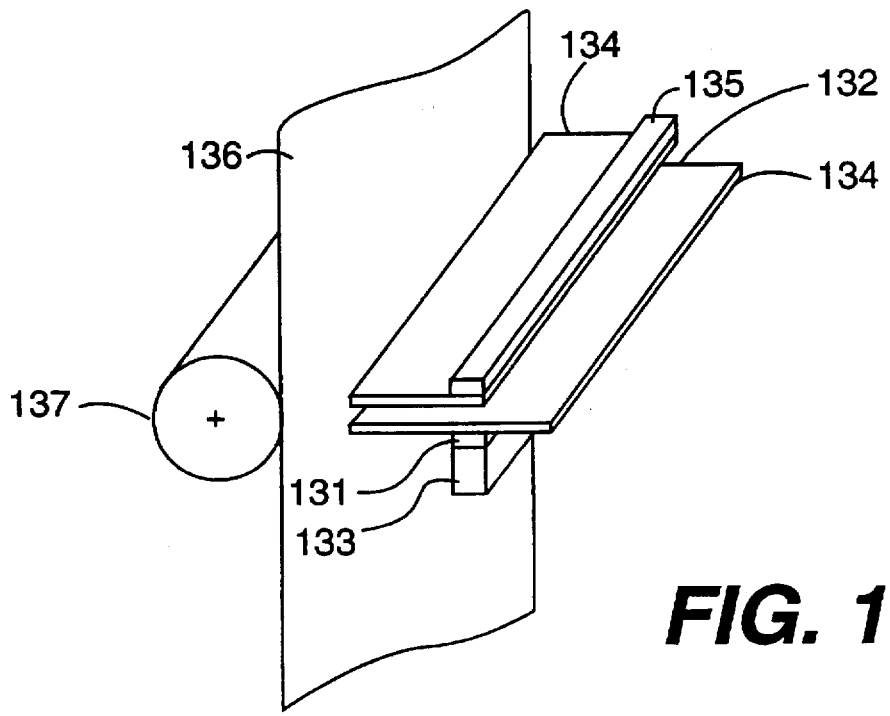
FIG. 13 shows another conceptual view of a photo-inducible magnetic device of the present invention in a printer arrangement.

FIG. 13 shows a conceptual view of an inkjet head which does not have divided nozzles. An ink layer 132 is formed within a slit composed of two plates 134. A photo-inducible magnetic material 131 is placed between ink layer 132 and a magnet 133 so that leaked magnetic flux can be applied to ink layer 132. A light emitting head 135, such as an LED array or EL array, is placed so that localized portion of photo-inducible magnetic material 131 can be irradiated by light.

An electric field between ink layer 132 and an object 136, such as a paper, to be printed on a roller 137 is concentrated in a portion of the protruded portion of ink layer 132. Then the portion could fly to the object 136 and object 136 would be printed. Such an electric field may be applied between ink layer 132 and an edge of the slit.

EXAMPLE 8

Figure 14A:
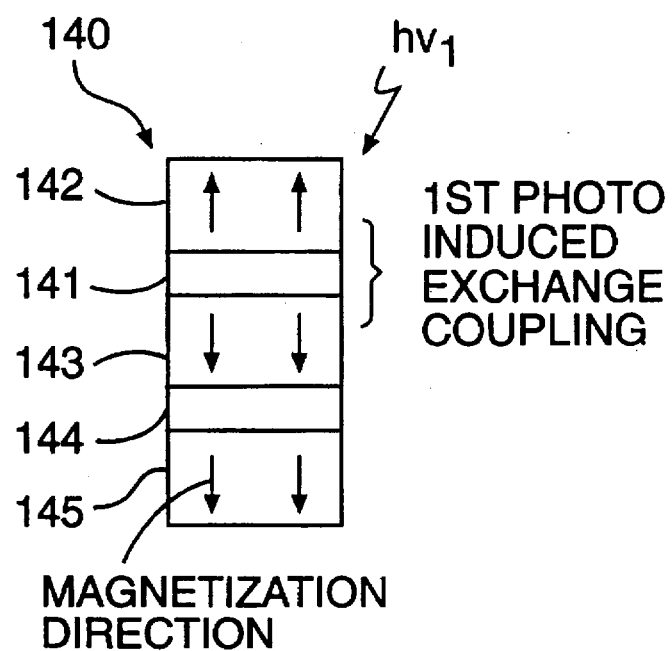
FIGS. 14(a) and (b) show other conceptual views of a photo-inducible magnetic device of the present invention.
Figure 14B:
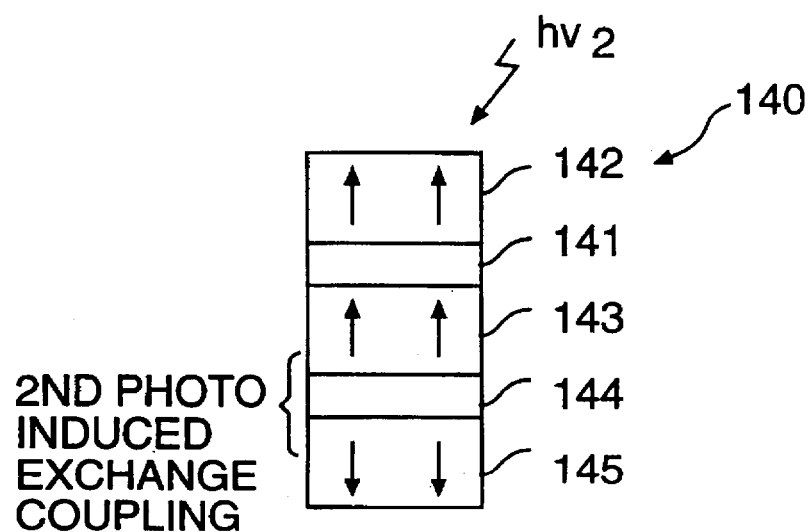

A photo-inducible magnetic material can be applied to a optical magnetic recording medium. FIG. 14 shows a conceptual view of a optical magnetic recording medium utilizing the present invention.

This recording medium is composed of a multilayer 140 including three magnetic layers and two semiconductor layers, essentially. A first semiconductor layer 141 is inserted between a first magnetic layer 142 and a second magnetic layer 143 and, further, a second semiconductor layer 144 is inserted between second magnetic layer 143 and a third magnetic layer 145.

A first photo-induced exchange coupling between first and second magnetic layers 142,143 occurs when a first light (hv1) which can activate carriers in first semiconductor layer 141 is irradiated to multilayer 140. In this case, the first photo-induced exchange coupling is antiferromagnetic.

A second photo-induced exchange coupling between second and third magnetic layers 143,145 occurs when a second light (hv2) which can activate carriers in second semiconductor layer 144 is irradiated to multilayer 140. In this case, the second photo-induced exchange coupling is antiferromagnetic, also.

In this example, it is assumed that an exchange coupling without light-irradiation does not exist.

Therefore, if the first light (hv1) is irradiated, the magnetization of second magnetic layer 143 is put under control of the photo-induced magnetism between first and second magnetic layers 142,143. On the other hand, when the second light (hv2) is irradiated, the magnetization of second magnetic layer 143 is put under control of the photo-induced magnetism between second and third magnetic layers 143, 145.

A direction of magnetization in first magnetic layer 142 is upward and a direction of magnetization in third magnetic layer 145 is downward. First and third magnetic layers 142,145 are magnetization fixed layers so that directions of the magnetization in first and third magnetic layers 142,145 will not change. In other words, coercive forces of first and third magnetic layers 142,145 are larger than the coercive force of second magnetic layer 143.

As a result, the direction of magnetization of second magnetic layer 143 can be changed by selecting lights, hv1 or hv2. When first light hv1 is selected, the magnetization of second magnetic layer 143 is downward (FIG. 14(a)). On the otherhand, when second light hv2 is selected, the magnetization of second magnetic layer 143 is upward (FIG. 14(b)).

During light-irradiation, the information concerning the magnetization direction of second magnetic layer 143 can be maintained. However, if the coercive force of second magnetic layer 143 is sufficiently high, the magnetic state of second magnetic layer 143 obtained by light-irradiation can be maintained without light-irradiation.

Accordingly, second magnetic layer 143 can be used as a recording layer.

The magnetization direction of second magnetic layer 143 can be detected by use of a magneto-optical effect as in conventional optical magnetic recording.

For example, multilayer 140 is irradiated by a polarized light hv3 having a wavelength which does not excite any of first and second semiconductor layers 141,144. Since a polarized angle of the reflected light from second magnetic layer 143 changes with the magnetization direction of second magnetic layer 143 due to a Kerr effect, the magnetization direction can be determined by detecting a change of a polarized angle of the reflected light. This is not limited to the reflected light. A transmitted light also can be used.

Accordingly, information about "1" can be written in second magnetic layer 143 and can be erased as "0". For example, the upward state of second magnetic layer 143 can be defined as "1" and the downward state of second magnetic layer 143 can be defined as "0". When writing, light hv1 is used and when erasing, light hv2 is used. Further, when reading, light hv3 is used.

The above-mentioned optical magnetic medium clearly differs from a conventional medium using an external magnetic field. In an apparatus for a conventional optical magnetic medium, a component producing an external magnetic field, such as a magnet, is necessary. Locally heating under an external magnetic field enables a magnetization direction of a locally heated portion of the medium to be arranged in the direction of the external magnetic field.

On the other hand, the above-mentioned medium concerning the present invention does not need an external magnetic field. Therefore, the entire equipment can be downsized.

It is believed that photo-induced magnetism is caused by carriers excited directly by photons or by thermal action. Therefore, when photo-induced magnetism is caused directly by photons, the time required for writing or erasing can be remarkably reduced.

Furthermore, since the above-mentioned example does not need an external magnetic field for erasing, overwriting is facilitated in comparison with a conventional medium. As a result, data transfer speed can be remarkably improved.

Figure 15A:
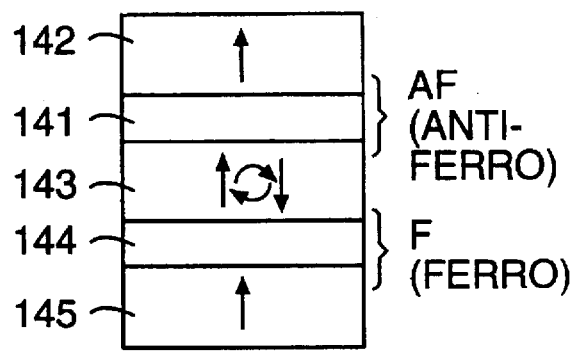
FIGS. 15(a), (b) and (c) show additional conceptual views of a photo-inducible magnetic device of the present invention having ferromagnetic and antiferromagnetic layers.

Other combinations of exchange couplings are available besides that shown in FIG. 14. FIGS. 15(a), (b), and (c) show other examples. All examples can control the magnetization direction of second magnetic layer 143.

FIG. 15(a) shows a case in which a first photo-inducible exchange coupling between first and second magnetic layers 142,143 is antiferromagnetic; a second photo-inducible exchange coupling between second and third magnetic layers 143,145 is ferromagnetic; the magnetization direction of first magnetic layer 142 is upward; and the magnetization direction of third magnetic layer 145 is upward, also.

Figure 15B:
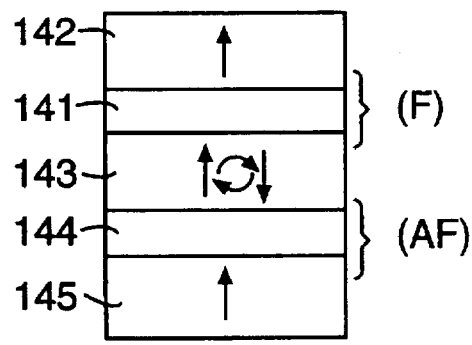

FIG. 15(b) shows a case in which a first photo-inducible exchange coupling between first and second magnetic layers 142,143 is ferromagnetic; a second photo-inducible exchange coupling between second and third magnetic layers 143,145 is antiferromagnetic; the magnetization direction of first magnetic layer 142 is upward; and the magnetization direction of third magnetic layer 145 is upward, also.

Figure 15C:
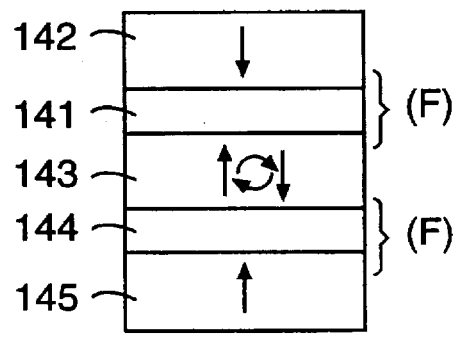

FIG. 15(c) shows a case in which a first photo-inducible exchange coupling between first and second magnetic layers 142,143 is ferromagnetic; a second photo-inducible exchange coupling between second and third magnetic layers 143,145 is ferromagnetic, also; the magnetization direction of first magnetic layer 142 is downward; and the magnetization direction of third magnetic layer 145 is upward.

The combinations concerning exchange couplings and magnetization directions satisfy the following relation:

$Z1*Z2=-1$ $Z1=X1*Y1, Z2=X2*Y2$;

X1: a coefficient about a magnetization direction of a first magnetic layer,

Y1: a coefficient about a photo-induced exchange coupling between first and second magnetic layers, X2: a coefficient about a magnetization direction of a third magnetic layer, and Y2: a coefficient about a photo-induced exchange coupling between second and third magnetic layers, Magnetic layers composing the above-mentioned optical magnetic recording medium may be made of a perpendicular magnetized thin film.

A magnetization fixed layer such as first and third magnetic layers 142,145 may be composed of magnetic materials having a high coercive force, such as MnBi alloys, MnCuBi alloys, amorphous TbFe or amorphous TbFeCo.

A recording layer such as second magnetic layer 143 may be composed of magnetic materials having a lower coercive force than the magnetization fixed layer, such as Co/Pt superlattices, Co/Pd superlattices, MnPtSb alloys, amorphous GdTbFe, or MnCuBi alloys. However, it is required that the coercive force of a recording layer be sufficiently high to maintain a magnetic state without light-irradiation, e.g., about 1 kOe or more.

A semiconductor layer such as first and second semiconductor layers 141,144 may be composed of, for example, FeSi, FeSi$_2$, CrSi$_2$, CoSi$_2$, or MnSi$_{1.7}$. First and second semiconductor layers 141,144 are required to be composed of different materials having different energy gaps.

EXAMPLE 9

A photo-induced magnetism can be applied to a scanning type microscope (STM) which can observe a magnetic state, especially a magnetization direction.

Figure 16A:
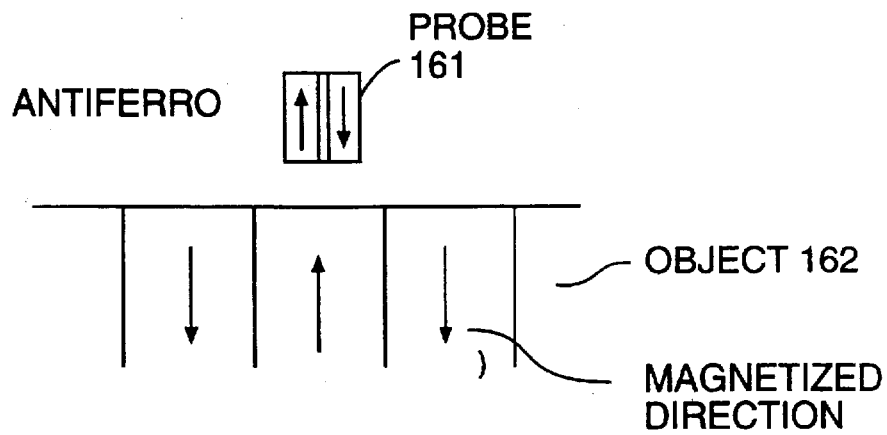
FIGS. 16(a), (b) and (c) show conceptual views of a photo-inducible magnetic device of the present invention applied to a probe of a scanning microscope.

FIGS. 16(a), (b) and (c) show conceptual views of a primary portion of a scanning type microscope of the present invention. A probe 161 is composed of a photo-inducible magnetic and electrically conductive material, which is antiferromagnetic without light-irradiation and ferromagnetic during light-irradiation, or vice-versa.

Figure 16B:
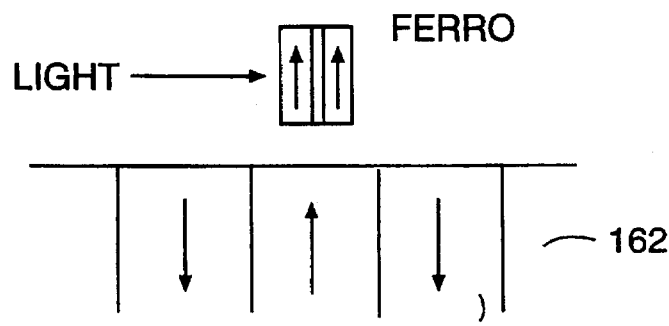

When probe 161 is sufficiently close to an object 162, a tunneling current flows. While the distance between probe 161 and object 162 is maintained, light is irradiated on probe 161 so that the probe is magnetized. In FIGS. 16(b), (c), the magnetization direction of probe 161 is upward.

Figure 16C:
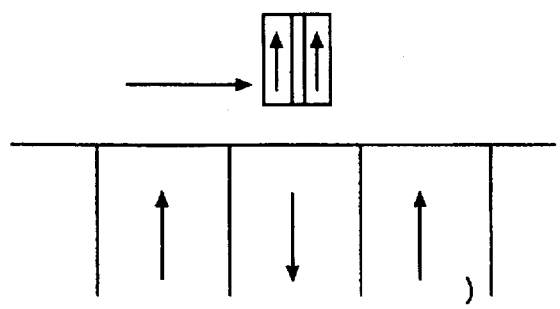

If the portion of object 162 facing toward probe 161 has the same magnetization direction as probe 161, i.e., upward (FIG. 16(b)), a tunneling probability increases more than an initial state shown in FIG. 16(a). On the other hand, if the portion of object 162 facing toward probe 161 has the opposite magnetization direction as probe 161, i.e., downward (FIG. 16(c)), the tunneling probability decreases less than the initial state.

Therefore, the magnetic state of object 162 can be determined by comparing the tunneling current during light-irradiation to that of the initial state. If a portion of object 162 facing toward probe 161 is not magnetic, the tunneling probability does not change. The observation is continued with scanning probe 161.

Figure 17:
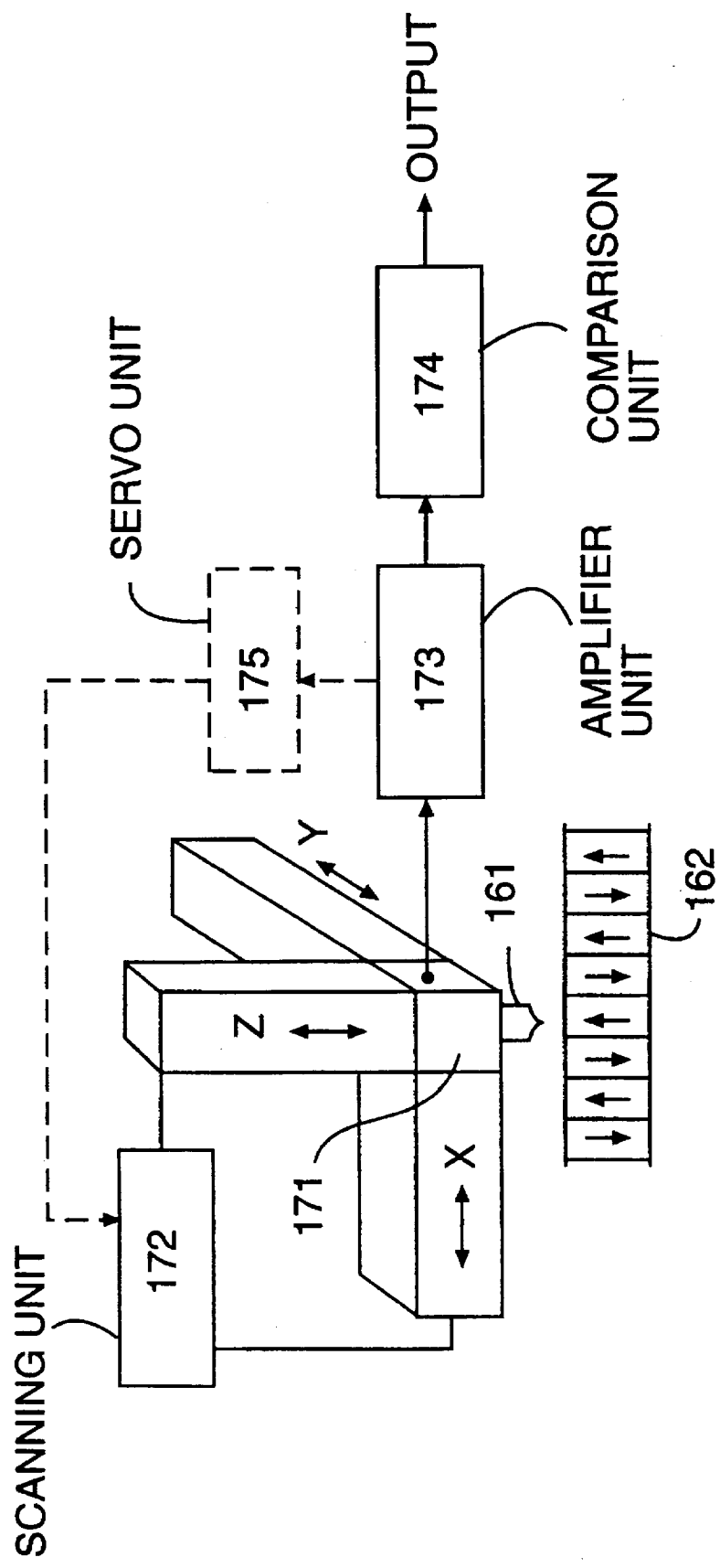
FIG. 17 shows another conceptual view of a photo-inducible magnetic device of the present invention in a scanning type microscope.

FIG. 17 shows a conceptual view of a scanning type microscope of the present invention. Probe 161 is mounted on a scanner 171 controlled by scanning unit 172 so that probe 161 can move in x-y-z directions. For example, scanner 171 may be composed of three parts of piezoelectric material, respectively corresponding to three perpendicular directions.

A bias voltage is applied between probe 161 and object 162. Probe 161 is moved by scanner 171 in the z-direction, i.e., is moved close to object 162 or apart from object 162, until a tunneling current, which is amplified by an amplifier unit 173, becomes a predetermined value. After that, probe 161 is irradiated by light and then a tunneling current is detected again. The tunneling current during light-irradiation is compared to the tunneling current without light-irradiation at a comparison unit 174 and then the information is output and may be stored.

Probe 161 is moved by scanner 171 in an x-y plane and the same measurements are performed. The distance between probe 161 and object 162 is kept constant. This can be performed by apparatus, such as a servo unit 175. As a result, the magnetic distribution of object 162 in an x-y plane can be determined. The magnetization direction of probe 161 during light-irradiation is required to be one direction. If the direction is random at every light-irradiation, the magnetic state of object 162 cannot be determined.

Accordingly, the photo-inducible magnetic material is preferably introduced with magnetic anisotropy. Further, since the magnetization direction is required to be the same every time light-irradiation occurs, is it is preferable that an external magnetic field be applied to the photo-inducible magnetic material or the photo-inducible magnetic material be composed of magnetic layers having a high coercive force and a low coercive force as shown in FIG. 1.

The resolution of this microscopy depends on the thickness of a magnetic layer composing probe 161. Therefore, the thickness of magnetic layers is preferably within a range of about 1 to about 10 nm.

The required intensity of an irradiated light may depend on the thickness of a semiconductor layer composing probe 161, which is preferably small. The smaller the thickness, the smaller the required intensity. However, the thickness of a semiconductor layer composing probe 161 may be changed by desired photo-induced magnetism. Therefore, the thickness of the semiconductor layer is preferably within a range of about 1 to about 10 nm.

In this example, the photo-induced magnetism is required to switch to an initial magnetic state when light-irradiation stops, which is like an actuator, but different from the recording medium. For example, when $J/(dK)<1$ is satisfied, a photo-induced magnetic state would become an initial magnetic state soon after light-irradiation stops, where "J" (erg/cm$^2$) is the magnitude of a magnetic exchange coupling between neighboring magnetic layers, "d" (cm) is the thickness of the magnetic layer, and "K" (erg/cm$^3$) is the anisotropy energy of the magnetic layer. The smaller the thickness of the semiconductor layer, the larger the value of "J".

Figure 18A:
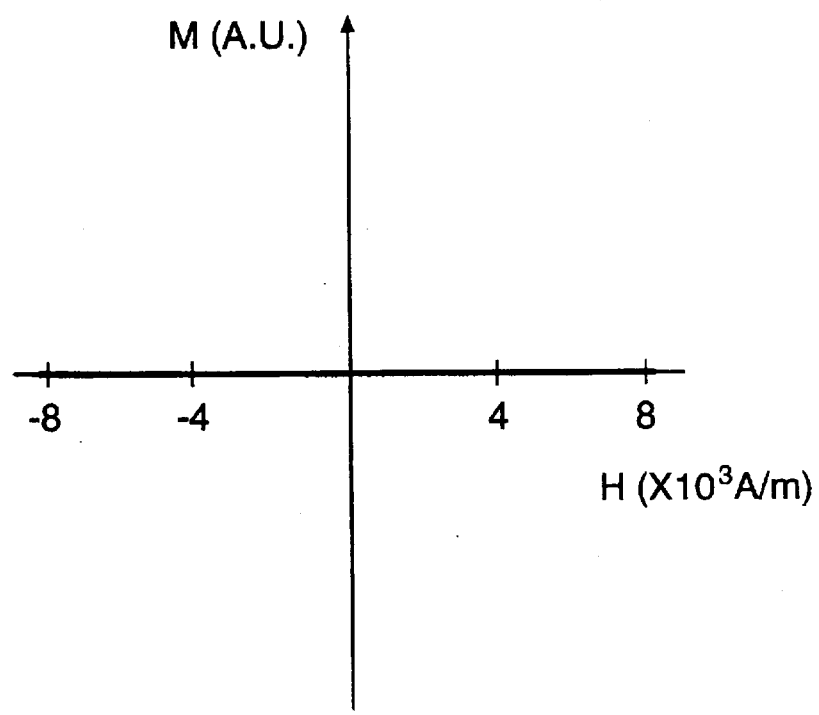
FIGS. 18(a) and (b) show magnetization loops of a photo-inducible magnetic device of the present invention as applied to a probe.

FIGS. 18(a) and (b) show magnetization loops of a photo-inducible magnetic material available for probe 161.

A magnetic layer of Fe is deposited on a substrate of Si by ion beam sputtering. A thickness of the magnetic layer is about 3 nm. A semiconductor layer of SiO is deposited on the magnetic layer. The thickness of the semiconductor layer is about 4 nm. Twenty sets of Fe/SiO are formed on the substrate and compose a multilayer.

Conditions of sputtering are, for example, that after exhausting a chamber at about $6.7\times10^{-5}$ Pa, the chamber is filled with $1.3\times10^{-2}$ Pa of Ar and then sputtering is performed under the condition that the acceleration voltage of Ar ions is about 500 V and the current of Ar ion beam is about 30 mA.

Figure 18B:
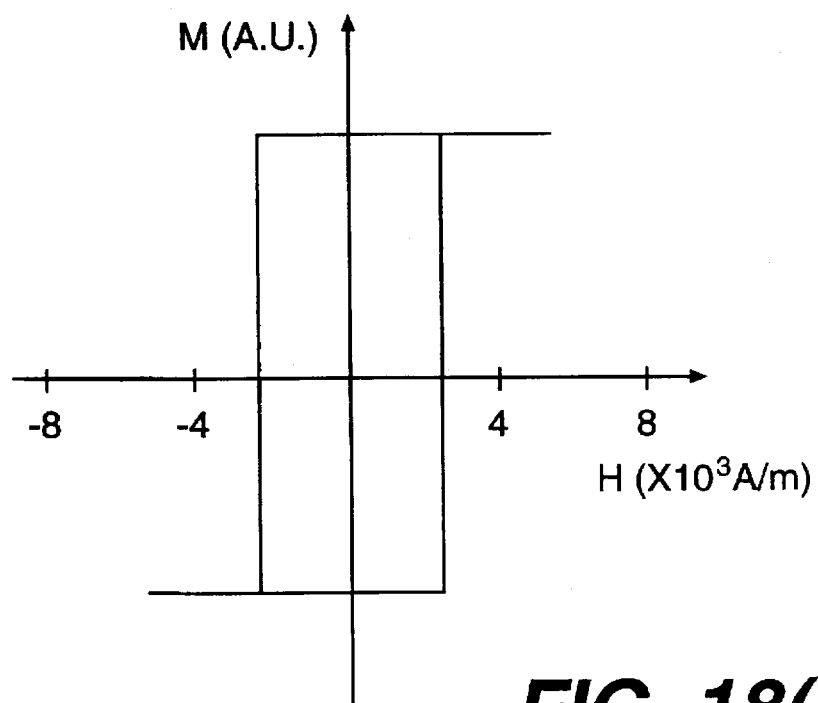

FIG. 18(a) shows a magnetization loop of the multilayer before light-irradiation and FIG. 18(b) shows a magnetization loop of the multilayer during light-irradiation by an Ar laser. Such a magnetization loop can be measured by a Kerr effect measuring unit. Before light-irradiation, the amount of magnetization is zero, however during light-irradiation, the amount of magnetization is large. Further, the magnetization can disappear soon upon terminating the light-irradiation.

The point diameter of probe 161 may determine the resolution of the microscopy. Therefore, the point diameter is preferably as small as possible. However, since too small a point diameter is difficult to make, the point diameter is preferably within a range about 1 to about 10 nm.

In the above-mentioned microscope, a magnetic state of a magnetic material could be detected with a resolution of about an atom size. Therefore, the microscope, which can be called a spin polarized STM, can be used as a reading head of a high density magnetic recording system which could read a magnetic state with a resolution of nanometers.

In the above-mentioned microscope, a tunneling current is detected. A magnetic force can be used besides the tunneling current as with AFM (atomic force microscope), also.

A probe of a photo-inducible magnetic material could be put on a cantilever. Magnetic force would change depending on the states shown in FIGS. 16(a), (b) and (c). For example, in the case of FIG. 16(b), probe 161 would be attracted to object 162. However, in the case of FIG. 16(c), probe 161 would be repulsed from object 162. Therefore, the position of probe 161 would move between the position of the case in FIG. 16(b) and that of the case in FIG. 16(c), wherein the position of the case in FIG. 16(a) is center.

Therefore, the magnetic state of a localized portion of object 162 can be determined by detecting the position of probe 161. The position of probe 161 can be detected by the same method as AFM. For example, reflected light from the cantilever can be used. The reflecting angle would be changed by the position of probe 161. Therefore, the magnetic state can be detected by detecting reflected light from the cantilever with a photodetector.

It will be apparent to those skilled in the art that various modifications and variations can be made in the photo-inducible magnetic device of the present invention without departing from the spirit or scope of the invention. Thus, it is intended that the present invention cover the modifications and variations of the invention provided they come within the scope of the appended claims and their equivalents.

What we claim is:

1. A magnetic device, comprising:
   a first magnetic layer;
   a second magnetic layer in overlapping relation with the first magnetic layer and having a coercive force smaller than that of the first magnetic layer; and
   a semiconductor layer between the first and second magnetic layers so that photo-induced magnetism occurs between the first and second magnetic layers when the semiconductor layer is irradiated with light.

2. A magnetic device according to claim 1, wherein each magnetic layer has an in-plane uniaxial magnetic anisotropy.

3. A magnetic device according to claim 1, wherein each magnetic layer is a vertical magnetized layer.

4. A magnetic device according to claim 1, further comprising a third magnetic layer in overlapping relation with the second magnetic layer, the third magnetic layer having a coercive force greater than the coercive force of the second magnetic layer, and a second semiconductor layer between the second and third magnetic layers, magnetism being induced between the second and third magnetic layers when the second semiconductor layer is irradiated with light.

5. A magnetic device according to claim 1, further comprising a third magnetic layer in overlapping relation with the second magnetic layer, the third magnetic layer having a coercive force greater than the coercive force of the second magnetic layer, and a second semiconductor layer of a material different from the material of the first semiconductor layer and between the second and third magnetic layers, magnetism being induced between the first and second magnetic layers when the second semiconductor layer is irradiated with light having a first optical frequency, and magnetism being induced between the second and third magnetic layers when the second semiconductor layer is irradiated with light having a second optical frequency.

6. A magnetic device according to claim 1, wherein the coercive force of the second magnetic material is sufficiently large that the magnetized direction during light-irradiation is maintained when the light-irradiation is terminated.

7. A magnetic device according to claim 1, wherein the coercive force of the second magnetic material is at least about 1 kOe.

8. A magnetic device according to claim 1, wherein the first and second magnetic layers and the semiconductor layer are sized for mounting in a probe for a scanning microscope, the microscope including means for detecting at least one of a difference in tunneling current between the probe and a sample and a difference in magnetic force between the probe and the sample when the probe is irradiated with light and when the probe is not irradiated with light.

9. A magnetic device according to claim 1, wherein the first and second magnetic layers and the semiconductor layer are disposed on a recording medium for writing of information onto the recording medium by light illumination.

10. A magnetic device, comprising:
    a first magnetic layer;
    a second magnetic layer; and
    a semiconductor layer between the first and second magnetic layers so that photo-induced magnetism occurs between the first and second magnetic layers when the semiconductor layer is irradiated with light, at least one of the first and second magnetic layers comprising a magnetic material containing at least about 50% Co.

11. A magnetic device, comprising:
    a first magnetic layer;
    a second magnetic layer on the first magnetic layer;
    a first semiconductor layer between the first and second magnetic layers so that photo-induced magnetism occurs between the first and second magnetic layers when the first semiconductor layer is irradiated with light;
    a third magnetic layer on the second magnetic layer; and
    a second semiconductor layer between the second and third magnetic layers so that photo-induced magnetism occurs between the second and third magnetic layers when the second semiconductor layer is irradiated with light.

12. A magnetic device according to claim 11, wherein a material of the first semiconductor layer is different from a material of the second semiconductor layer.

13. A magnetic device according to claim 11, wherein the first semiconductor layer is responsive to a different optical frequency of light in inducing magnetism between the first and second magnetic layers than is the second semiconductor layer in inducing magnetism between the second and third magnetic layers.

14. A magnetic device according to claim 10, wherein each magnetic layer has an in-plane uniaxial magnetic anisotropy.

15. A magnetic device according to claim 10, wherein each magnetic layer is a vertical magnetized layer.

16. A magnetic device according to claim 10, wherein the coercive force of the second magnetic material is sufficiently large that the magnetized direction during light-irradiation is maintained when the light-irradiation is terminated.

17. A magnetic device according to claim 10, wherein the coercive force of the second magnetic material is at least about 1 kOe.

* * * * *